United States Patent [19]
Iwasa

[11] Patent Number: 5,724,820
[45] Date of Patent: Mar. 10, 1998

[54] PERMANENT MAGNET SYSTEM BASED ON HIGH-TEMPERATURE SUPERCONDUCTORS WITH RECOOLING AND RECHARGING CAPABILITIES

[75] Inventor: Yukikazu Iwasa, Weston, Mass.

[73] Assignee: Massachusetts Institute of Technology, Cambridge, Mass.

[21] Appl. No.: 599,607

[22] Filed: Feb. 9, 1996

[51] Int. Cl.$^6$ ............................................. F25B 19/00
[52] U.S. Cl. ........................... 62/51.1; 62/54.2; 62/383
[58] Field of Search ............................ 62/48.1, 51.1, 62/54.2, 383; 505/892

[56] References Cited

U.S. PATENT DOCUMENTS

| | | | |
|---|---|---|---|
| 3,745,785 | 7/1973 | Crawford | 62/54.2 |
| 4,438,632 | 3/1984 | Lessard et al. | 62/383 |
| 4,788,834 | 12/1988 | Usui et al. | 62/51.1 |
| 4,796,432 | 1/1989 | Fixsen et al. | 62/51.1 |
| 4,884,409 | 12/1989 | Quack et al. | 62/51.1 |
| 4,956,974 | 9/1990 | Planchard et al. | 62/298 |
| 5,220,800 | 6/1993 | Muller et al. | 62/51.1 |
| 5,304,972 | 4/1994 | Sato | 62/51.1 |

*Primary Examiner*—Ronald C. Capossela
*Attorney, Agent, or Firm*—Hamilton, Brook, Smith & Reynolds, P.C.

[57] ABSTRACT

In a "permanent" magnet system based on high-temperature superconductors, a superconducting magnet is cooled to a temperature below its critical temperature with a cooler. The magnet is coupled to a cold body of solid nitrogen which is insulated to minimize heat input to the system. The superconducting magnet is energized to generate a magnetic field and the cooler is removed. Unlike conventional superconducting magnets in which the magnet operating temperature is maintained at a fixed point, in the system of the present invention the operating temperature is allowed to rise from an initial value of approximately 20 K to as high as 63 K (the melting point of nitrogen), enabling operation over an extended period without the aid of direct cooling. The superconducting magnet is recooled periodically to lower its temperature to approximately 20 K. The magnetic field is maintained and the system is fully operable during the recooling process. For large systems, the time period between recooling cycles can exceed one year. This cryocoolerless lightweight "permanent" magnet system is particularly effective in on-board or portable applications which would benefit from the absence of a cumbersome cryocooler.

20 Claims, 6 Drawing Sheets

5,724,820

PERMANENT MAGNET SYSTEM BASED ON HIGH-TEMPERATURE SUPERCONDUCTORS WITH RECOOLING AND RECHARGING CAPABILITIES

BACKGROUND OF THE INVENTION

Conventional low-temperature superconducting magnets are designed to operate at a particular temperature, for example 4.2 K (the boiling temperature of liquid helium at atmospheric pressure), which is less than the critical temperature $T_c$ of the superconducting material. Such magnets operate while immersed in liquid helium or while connected on a full-time basis to a cooling device. Both techniques require continuous cooling through use of a cooler, cryocooler, or refrigerator. These cooling devices make operation of the magnetic systems cumbersome.

Permanent magnets based on ferromagnetic material provide a continuous magnetic field without the need for a cooling system. However, permanent magnets are impractical for generating strong magnetic fields or complex field profiles, both of which are readily achievable with superconducting magnets.

SUMMARY OF THE INVENTION

The present invention is directed to an apparatus and method for a "permanent" superconducting magnet system which combines the simplicity of conventional permanent magnet systems with the field strength and versatility of superconducting magnet systems.

The magnet of the present invention is based on high-temperature superconductors. The magnet operates in a system which employs several novel features. A key feature is the ability to operate without reliance on continuous cooling by a refrigerator. A volume of solid nitrogen of about the same size as the magnet winding is incorporated into a cold system containing the high-temperature superconducting magnet. This significantly enhances the heat capacity of the system over that of the magnet's mass alone, with a modest increase in overall weight of the system. The magnet's operating temperature is deliberately allowed to vary over a wide span, from initially 20 K to as high as 63 K, the melting temperature of nitrogen. Heretofore, superconducting magnets have been designed to operate at a virtually constant temperature. The system further incorporates stringent minimization of total heat input to the cold system.

Because the system utilizes an electromagnet, it is capable of providing magnetic fields with strength-to-volume ratios significantly greater than those feasible with conventional ferromagnetic-based permanent magnets. Upon being energized, the magnet maintains a magnetic field for long periods of time without being continuously coupled to a cryocooler for refrigeration. Periodic recooling is required to maintain the system at a temperature below the critical temperature $T_c$ of the superconducting magnet or 63 K, whichever is lower. For large systems, the time period between recooling cycles can exceed one year.

This cryocoolerless "permanent" magnet system is applicable where lightweight or portable magnets providing a constant field are required. Applications for high-temperature superconducting magnets based on this invention include on-board systems, Maglevs (magnetic levitation transport vehicles), space and naval ships, helicopters, and portable MRI and other magnetic systems. The invention may also be used to provide levitated platforms for art displays and entertainment performances. For most of these applications, the recooling-to-recooling time period can be as short as an hour, a day, or a week; or as long as several years.

An additional innovative idea incorporated into the invention involves recooling the magnet without interfering with the magnetic field. The system is designed to be recooled while it maintains a constant field so as to make the field literally permanent subject to periodic recooling. Like rechargeable batteries, the superconducting coil may also be recharged if the system's critical temperature $T_c$ is exceeded and consequently, the magnetic field decays.

The apparatus of the invention comprises a superconducting magnet operating in a persistent state at a temperature below its critical temperature $T_c$. The superconducting magnet generates a magnetic field. Insulation surrounds the magnet for minimizing heat input to the magnet. A cooling device is coupled to the magnet when the temperature of the magnet rises to a first temperature $T_1$, less than the critical temperature $T_c$. The cooling device is decoupled from the magnet when the temperature of the magnet lowers to a second temperature $T_2$. The superconducting magnet continues to generate a magnetic field over an extended period of time while the superconducting magnet temperature rises from $T_2$ to $T_1$. During this time, the cooling device is decoupled from the magnet.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
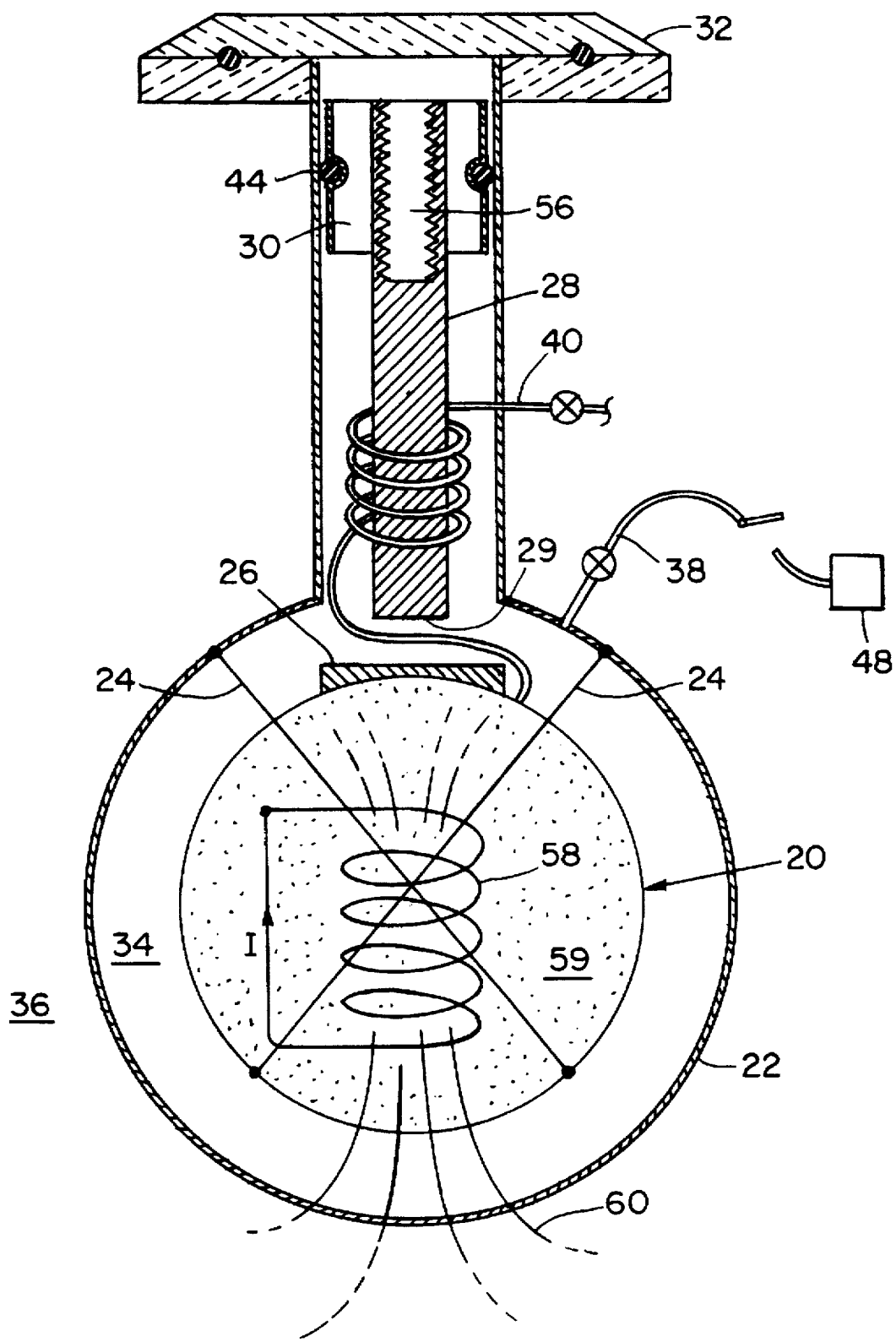
FIG. 1 is a schematic illustration of the principle components of the present invention.

Unlike conventional "low-temperature" superconductors which operate in a superconducting state only at a fixed temperature, for example 4.2 K, the present invention is directed to a permanent magnet system based on use of high-temperature superconductors operable over a range of temperatures, for example 20 K to as high as 63 K (the melting temperature of nitrogen). A superconducting magnet comprising a coil of superconducting material, for example BSSCO-2223 or BSSCO-2212, is placed inside an insulated cold body. The superconductor operates in the well-known "persistent" mode, in which current continuously flows in an endless loop without power loss. This, in turn, generates a magnetic field which is maintained as long as the persistent current flows.

A cryocooler lowers the temperature of the superconductor to a temperature below its critical temperature $T_c$. The critical temperature is the temperature below which the superconductor material exhibits superconductivity. The superconductor is energized to produce a desired magnetic field and the cryocooler is removed. Depending on the size of the system and the effectiveness of the insulation, the magnetic field can be sustained for long periods of time, for example, a few hours to several years, before recooling is necessary.

The ability of the present invention to operate over a broad range of temperatures allows for operation independently of the cryocooler for extended periods of time. When the system is separated from the cooler, it is in effect a portable and permanent source of magnetic field requiring only periodic recooling to maintain its permanence.

A significant advantage of the present invention over the prior art is its ability to be recooled without interfering with the operation of the superconducting magnet. The superconducting magnet remains active in a persistent state as long as its temperature does not exceed the critical temperature $T_c$ of the superconducting material. To accomplish this, a cryocooler temporarily coupled to the insulated cold body lowers the temperature of the system to an appropriate level well below $T_c$, for example 20 K. The cryocooler is removed, and the recooling procedure is completed without impacting the magnetic field.

The theoretical operating duration of the system between cooling cycles is derived below. The duration depends on three parameters: temperature range of operation; total heat dissipation within and into the magnet system; total enthalpy contained in the cold system over the operating temperature range.

The present invention further incorporates innovative design features which permit practical operation. For example, the cold body 20 comprises a volume of solid nitrogen of about the same size as the magnet winding, roughly tripling the system's heat capacity over that of the magnet's mass, with an added increase in system weight of only approximately 10%. The magnet is operable over a wide temperature span, for example, from approximately 20 K at initial cooling to as high as 63 K after warming. The cryocooler is thus a temporary source of refrigeration for the system. Heretofore, superconducting magnets have always been designed to operate at a virtually constant temperature; and thus required continuous cooling. Furthermore, stringent minimization of total heat input to the cold system lengthens the recooling time cycle.

FIG. 1 is a schematic illustration of a preferred embodiment of the present invention. A cold body 20 preferably consists of a superconducting magnet 58 and a volume of solid nitrogen 59 comparable in size to the magnet volume. Nitrogen is a gas at room temperature (293 K), becomes a liquid at 77 K, and becomes a solid at 63 K. The cold body 20 is coupled to a room temperature shield 22 by supports 24, preferably formed of carbon fiber. The supports 24 cross each other as shown to provide a long distance between the shield 22 and the cold body 20, thereby minimizing heat input to the cold body 20 from the room temperature shield 22. The room temperature shield 22 surrounds the cold body 20, and a thermal rod 28. The shield 22 is preferably formed of aluminum or stainless steel.

A vacuum is drawn in the region 34 between the cold body 20 and the shield 22 to minimize heat transfer due to convection. In addition, the region 34 is provided with layers of superinsulation, preferably comprising aluminized mylar, to reduce heat transfer due to radiation. The cold body 20 and the shield do not contact each other except through the supports 24. This minimizes heat transfer due to conduction. The region 36 outside the shield 22 is assumed to be at room temperature (293 K) while the cold body 20 is assumed to be at superconducting temperatures during operation (less than 63 K).

A cold receiving plate 26, preferably comprising copper, is attached to a top portion of the cold body 20. A thermal rod 28, preferably comprising a heat-conducting material, for example copper, is disposed above the cold receiving plate 26. The rod 28 is slidably mounted relative to the room temperature shield 22 such that it slides between a position in which the end 29 of the rod is separated from the cold receiving plate 26 and a position in which the rod end 29 comes in contact with the receiving plate 26. The rod position is preferably biased such that while it is unloaded, it is separated from the cold receiving plate 26.

The top section of the rod includes a threaded hole 56 adapted for thermal coupling with a cold delivery system described below in conjunction with FIG. 2. An evacuated chamber 30, preferably comprising stainless steel, is attached to the top portion of the thermal rod 28. The chamber 30 includes an O-ring seal 44 in its mid-section. The chamber 30 and O-ring are coupled to the thermal rod 28 and therefore, are also slidable relative to the upper portion of the room temperature shield 22. The O-ring seal remains in contact with the walls of the room temperature shield 22 when the rod 28 slides into contact with the cold receiving plate 26. A cover plate 32 provides insulation and protects the thermal rod 28 and the evacuated chamber 30.

A gas escape tube 40 allows gas, for example nitrogen gas, to escape from the cold body if the solid cold body 20 warms enough to change to a gaseous state. A vacuum outlet 38 provides access for a vacuum pump 48, which is periodically attached to the outlet 38 to maintain a good vacuum in the vacuum region 34.

Figure 2A:
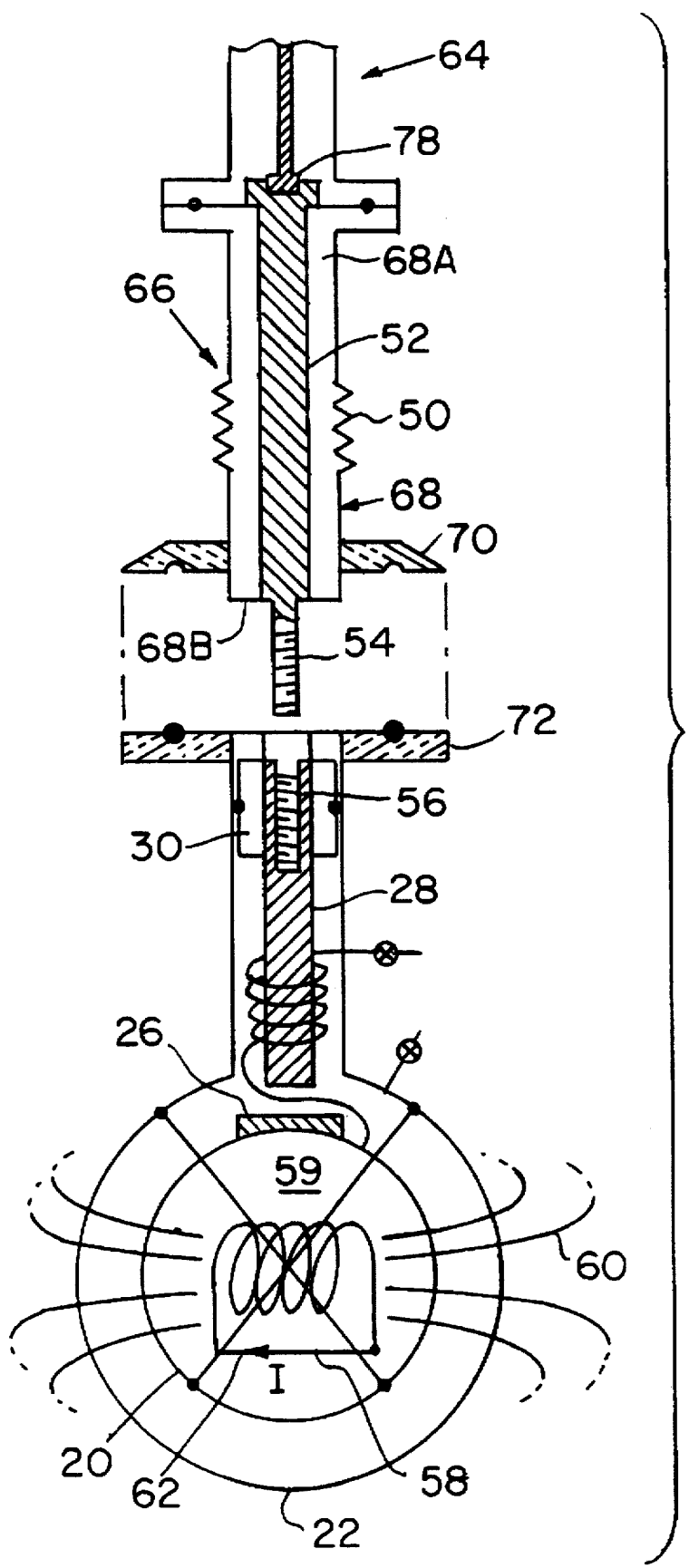
FIG. 2A–2C are sequential schematic illustrations of recooling of the magnet while the magnet continues to generate a magnetic field.
Figure 2B:
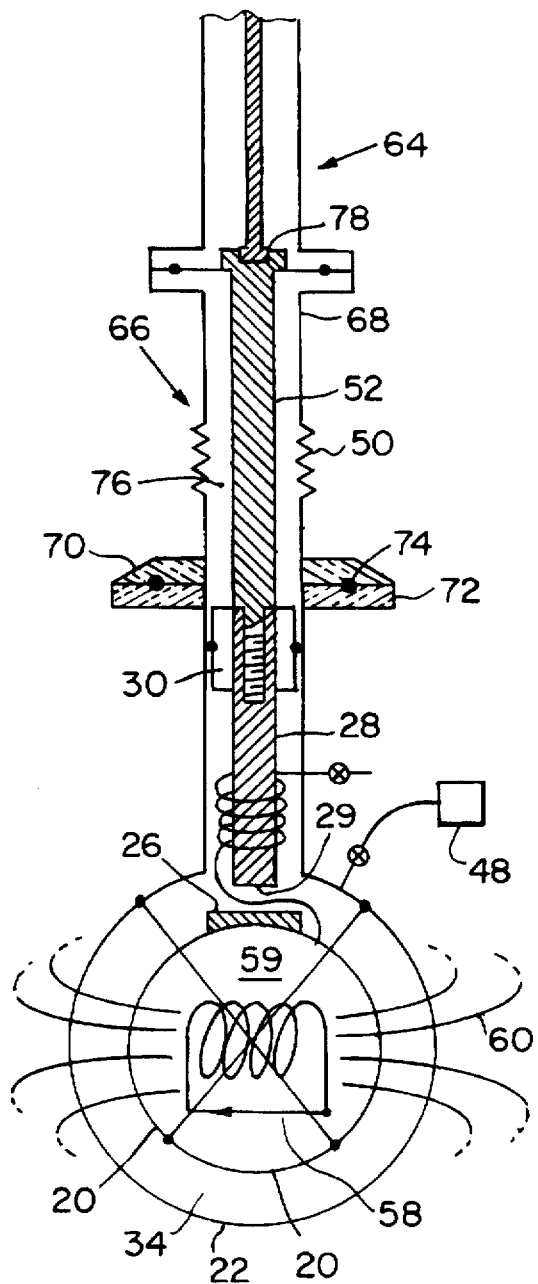
Figure 2C:
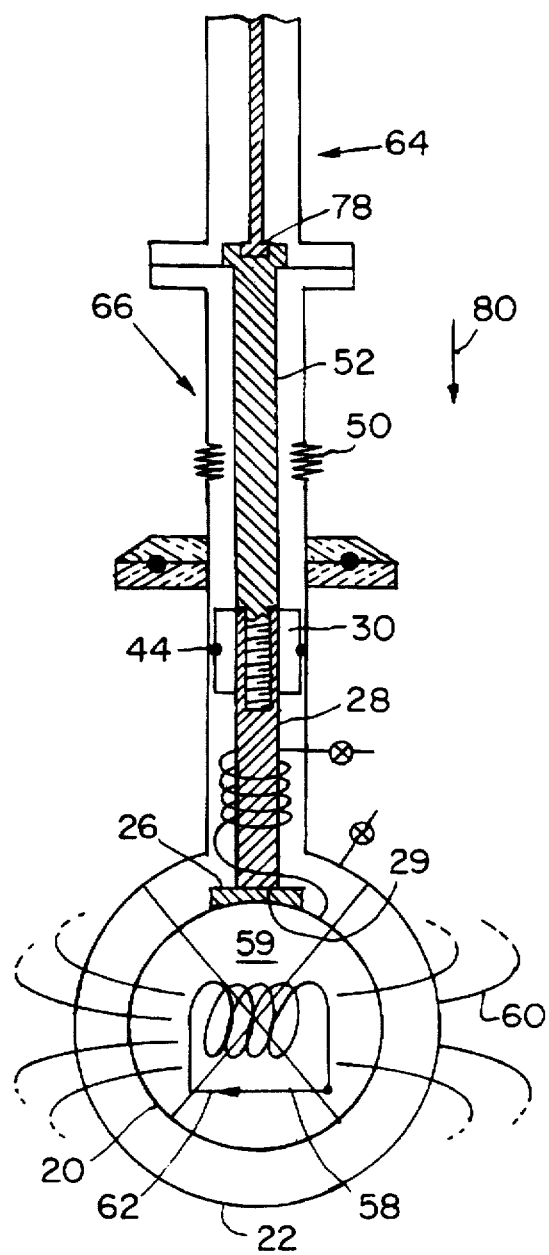

FIGS. 2A–2C sequentially illustrate a preferred method for recooling the system during operation, without interfering with the magnetic field 60. Note that in FIGS. 2A–2C, the magnet 58 and its associated field are oriented horizontally, while in FIG. 1, they are oriented vertically. A wide variety of orientations and configurations are possible.

In FIG. 2A, the superconducting magnet 58 continues to operate in persistent mode and therefore, current 62 flows through the coil continuously without power loss, thereby generating an electromagnetic field. Over time, heat is gradually drawn into the system through convection, conduction, and radiation. Consequently, the temperature of the cold body 20 (the superconducting magnet 58 and the solid nitrogen 59) rises. If the temperature of the magnet 58 were to exceed the critical temperature $T_c$ of the superconductor, then the superconductor would become resistive, and therefore the "persistent mode" current 62 flowing therein would decay. The magnetic field 60 would therefore also decay.

To avoid interfering with the magnetic field, the present invention provides an apparatus and method for recooling the superconducting magnet 58 during operation, that is, while it continues to generate a magnetic field 60. In FIG. 2A, before the superconductor temperature approaches $T_c$, a cooling device 66 is employed to recool the magnet 58. The magnet cover plate 32 (shown in FIG. 1) is removed, exposing the threaded hole 56 in the thermal rod 28. An extension rod 52 on the cooling device 66 includes a threaded portion 54 which is threaded into the hole 56. The extension rod 52 is preferably formed of a thermally conductive material, for example copper, and is coupled to a cryocooler cold head 78, adapted for cooling the extension rod 52 to an extremely low temperature, for example 20 K. The extension rod 52 is coupled to the top of a vacuum enclosure 68A and is slidably mounted relative to the bottom of the vacuum enclosure 68B. Bellows 50 are formed in the mid section of the vacuum enclosure 68 to allow for compression between the top 68A and bottom 68B portions of the enclosure 68.

In FIG. 2B, the cooling device 66 is in position for recooling the cold body 20, with the extension rod 52 coupled to the thermal rod 28 as shown. At this point, the extension rod 52 is at room temperature and the thermal rod 28 is at a temperature close to room temperature. The cooling device flange 70 and magnet flange 72 are secured together with an O-ring 74 therebetween. A vacuum is drawn in the region 76 within the vacuum enclosure 68. The vacuum pump 48 is also connected to the magnet system and activated to maintain a good vacuum in the region 34 between the cold body 20 and the shield 22. Next, the cryocooler 64 is activated.

As shown in FIG. 2C, when the cryocooler cold head 78, extension rod 52, and thermal rod 28 reach a temperature below the temperature of the cold body 20, the end 29 of the thermal rod 28 is placed in contact with the cold receiving plate 26 of the cold body 20 to recool the cold body. This is accomplished by pushing the vacuum enclosure 68 in a direction shown by arrow 80. Pushing causes the bellow 50 to collapse as the extension rod 52, thermal rod 28, vacuum chamber 30, and its O-ring 44 collectively move toward the cold receiving plate 26. When it is determined that the cold body 20 has cooled down to the target temperature, for example 20 K, the thermal rod 28 is lifted away from the cold receiving plate 26, and the thermal rod 28, extension rod 52, and vacuum chamber 30, are brought back to their original positions as shown in FIG. 2B. The cryocooler 64 is deactivated and the cryocooler cold head 78, extension rod 52 and thermal rod 28 are permitted to warm up to room temperature. The cryocooler 64 is removed along with the cooling device 66 and the cover plate 32 is reinstalled as shown in FIG. 1. In the method described above, the superconducting magnet 58 has been recooled to a temperature well below its critical temperature $T_c$ without interrupting the constant electromagnetic field 60 of the superconducting magnet 58.

For the case where the cold body 20 is initially at room temperature, the cooling procedure begins with the arrangement shown in FIG. 2C. The magnet 58 is cooled to an appropriate temperature below its critical temperature $T_c$. At this point, the magnet is not generating an electromagnetic field as the superconducting coil was not operating in persistent mode. The magnet therefore requires charging to induce current 62 therein after it reaches superconducting temperature.

Figure 3C:
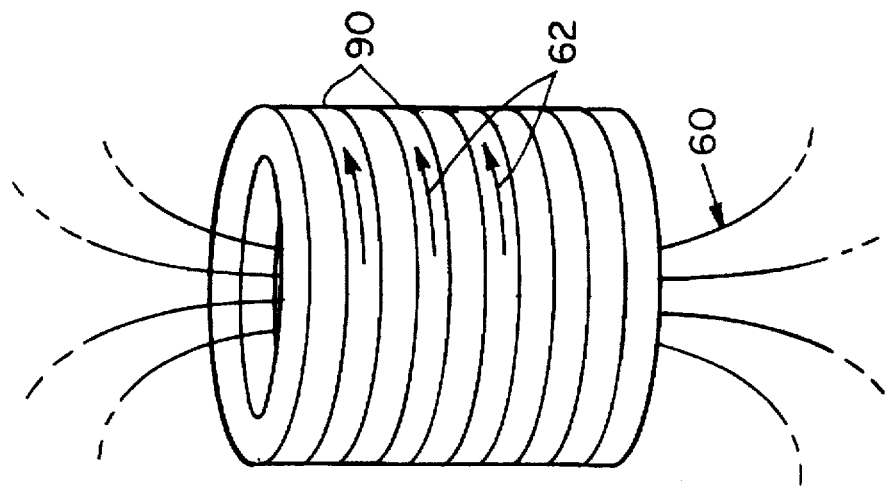
FIGS. 3A–3C illustrate alternative superconductor magnet embodiments.
Figure 3B:
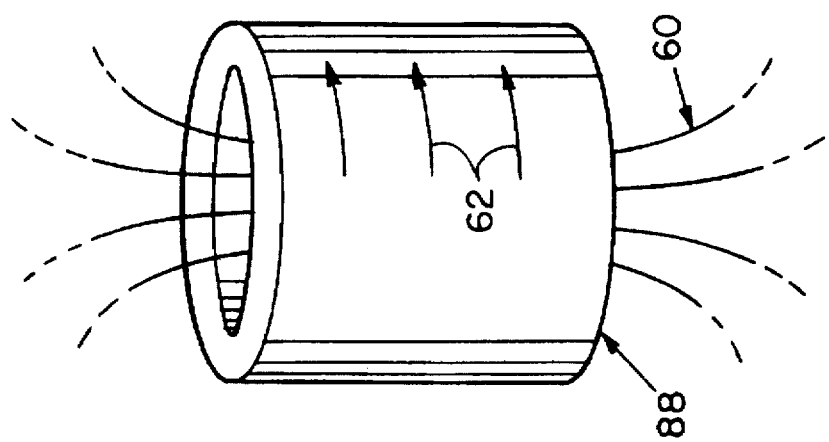
Figure 3A:
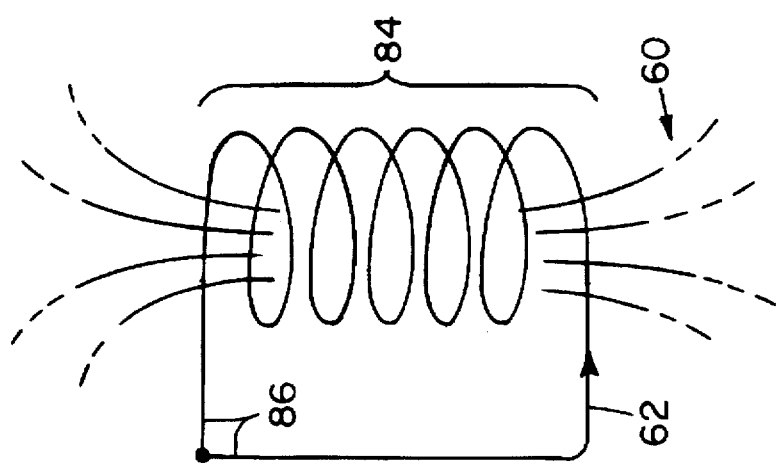

FIGS. 3A–3C illustrate alternative embodiments for the superconducting magnets used in the present invention. FIG. 3A is a persistent mode superconducting electromagnet comprising a coil 84 of superconducting wire material. The terminals 86 of the coil 84 are joined together to form a closed loop circuit. The coil 84 and the terminals 86 are encased in the cold body. Although it is desirable to join terminals 86 superconductively, in many applications wherein "permanence" means only an hour, a day, or a week, a resistive joint would be acceptable. In practical applications, it is only necessary to have a sufficiently small joint resistance so that the system's magnetic time constant is substantially longer than the system's recooling-to-recooling time period. When a current 62 is induced in the loop, the coil 84 induces a magnetic field 60 along the axis of the coil as shown.

FIG. 3B illustrates a superconducting magnet formed from a solid superconductor material cast in the shape of a cylinder 88. When current 62 is induced around the walls of the cylinder in the direction shown, a magnetic field 60 is generated.

In FIG. 3C, a cylindrical shape is formed similar to the shape of the magnet of FIG. 3B. In this case, however, the cylinder is formed of a plurality of thin rings 90, each a casting ring, stacked on top of each other to form solenoid. As current 62 is induced in the rings as shown, the collection of rings generates a magnetic field 60.

Although the magnets shown are solenoidal in nature, other magnet types for example, dipole, quadruple, and saddle are applicable to the present invention.

The superconducting magnet 58 once set in the cold body 20 and disposed in the system described above, is preferably energized by means of a flux change imposed by a charging electromagnet coupled thereto. When the magnet system is at room temperature and therefore nonsuperconducting, the charging electromagnet is coupled to the superconducting magnet. If the superconducting magnet is solenoidal, the solenoid is disposed into the bore of the charging electromagnet which would also be solenoidal. The superconducting magnet is next cooled down as described above.

Before the magnet reaches a superconducting temperature the charging electromagnet is energized to an appropriate field level which is kept constant. The superconducting magnet is cooled down to the target temperature below $T_c$, and the charging electromagnet is slowly discharged until it is discharged completely. This process induces a current in the superconducting magnet. The strength of the electromagnetic field generated by the superconducting magnet is determined by the electromagnetic properties of both the superconducting magnet and the charging magnet systems. For example, in the superconducting magnet, the field strength may be determined by the intensity of the current 62 and the number of windings 84 in the coil (FIG. 3A) or the dimensions of the cylinder 88 (FIGS. 3B,3C).

Figure 4A:
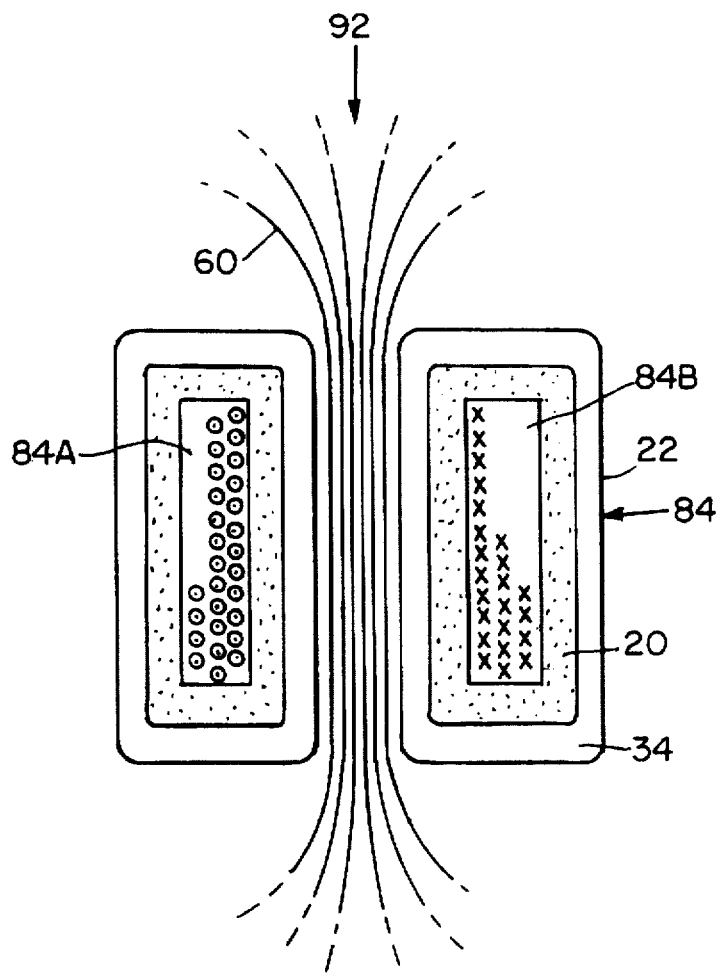
FIGS. 4A–4B are a sectional side view and a perspective view, respectively, of an alternative embodiment of the present invention illustrating a magnet having a semiconductor bore.
Figure 4B:
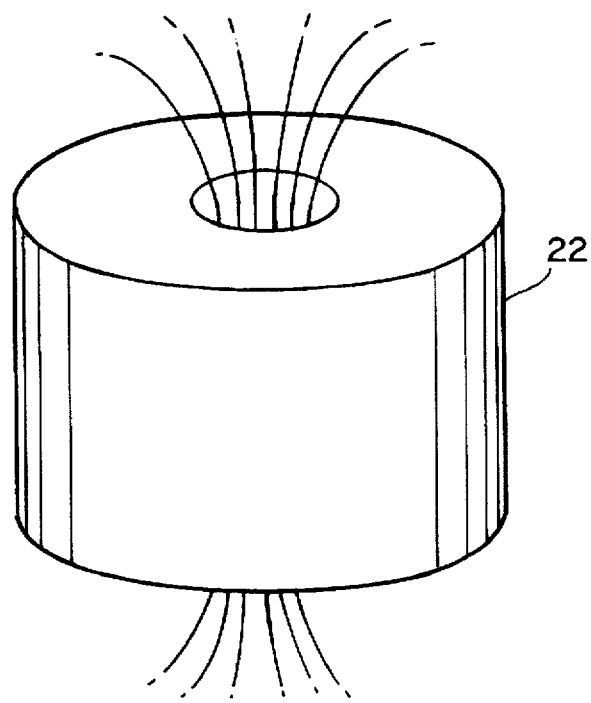

In an alternative embodiment illustrated in FIGS. 4A and 4B, the coil 84 has a bore 92 which is exposed to room temperature. This allows access to a concentrated region of magnetic flux lines 60. This is particularly applicable to generation of magnetic fields 60 which are smaller in magnitude. This embodiment comprises a superconducting coil 84A,84B encompassed by a cylindrically shaped cold body 20. The cold body 20 in turn is contained in a cylindrically-shaped room temperature shield 22. The region 34 between the cold body 20 and the room temperature shield 22 is packed with layers of superinsulation. Recooling is provided in the method described above in accordance with FIG. 2. The resulting structure takes on the shape shown in FIG. 4B. Note that in FIG. 4B, the peripheral components, for example, recooling and pumping components, are not shown.

For embodiments of the present invention which employ large magnets, current leads may be attached thereto so that the superconducting magnets can be energized directly. A charging magnet for large superconducting magnets would be enormous and therefore, would be prohibitively expensive. Because large systems can tolerate significantly more heat input to the system than small systems, current leads can be introduced into a large superconducting magnet system without making the total heat input excessive. When not in use, the current leads can be disconnected from the magnet terminals to minimize heat input to the cold body. To activate the magnet into persistent mode after energization that is achieved by the use of current leads, the magnet must be provided with a superconducting switch, a component shown in FIG. 5.

Figure 5C:
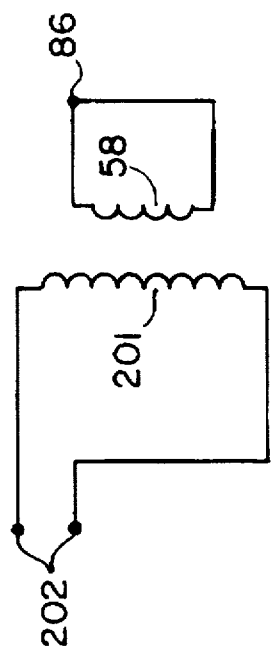
FIGS. 5A–5C present schematic views of an apparatus for energizing the magnet system.
Figure 5A:
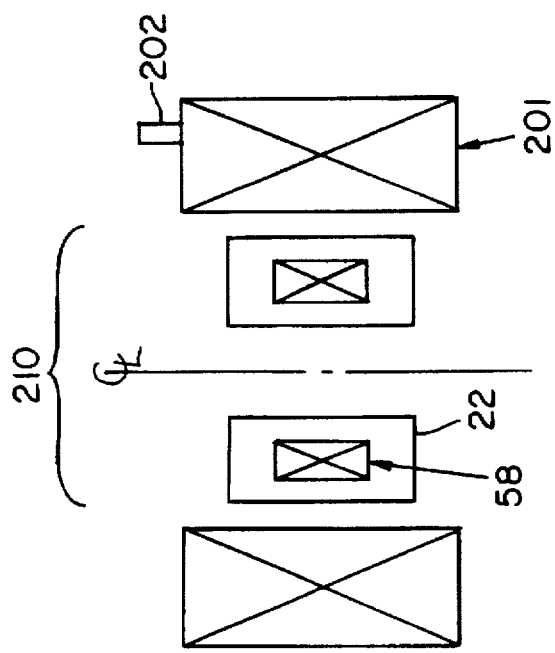
Figure 5B:
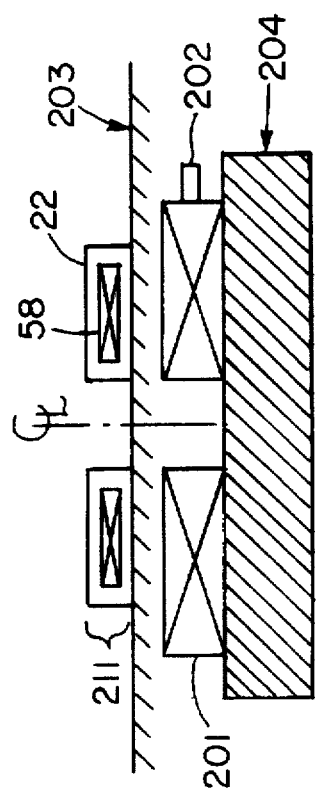

FIGS. 5A–5B present schematic cross-sectional views of an apparatus for energizing the new magnet system. The magnet system in each drawing is cylindrical. This inductive method is represented in the equivalent electrical circuit of FIG. 5C. As illustrated in FIG. 5C, the superconducting winding 58 is joined at terminals 86. In FIGS. 5A and 5B, each superconducting magnet system, based on this invention, is represented by two components: the winding 58 and the room-temperature shield 22.

In FIG. 5A, the superconducting magnet system 210 is placed in the room temperature bore of a charging magnet 201, which has terminals 202 for connection to a power supply (not shown). The superconducting magnet 210 at this stage is at a temperature above the critical temperature. While still nonsuperconducting, the charging magnet 201 is energized to a predetermined magnetic field level. After the superconducting magnet 210 is cooled down to a temperature close to an initial operating temperature of approximately 20 K, the charging magnet 201 is slowly discharged, inducing a current in the superconducting magnet 210, which in turn generates the desired magnetic field.

In FIG. 5B, the superconducting magnet system 211 comprises a flat disk. In this case, the magnet system is placed on a flat surface 203. Beneath the surface is placed a large charging coil 201 with terminals 202 for connection to a power source (not shown). The bottom section of the charging coil 201 is magnetically shorted with a steel disk 204 of sufficient thickness to prevent magnetic saturation in the steel. The disk 204 helps to reduce the total ampere-turns necessary in the charging coil 201 to provide a sufficient field in the bore of the superconducting magnet system. The charging sequence for this system is the same as the above system.

The embodiment of FIG. 5B can be applied for creating a levitated platform for art displays and entertainment performances. In this case, the superconducting magnet is allowed to cool down to its initial operating temperature of 20 K. During cool down, the charging coil 201 remains idle. The charging coil 201 is slowly energized, forcing a current to flow in the superconducting coil 58 in such a way to generate a magnetic field that opposes the impinging field created by the charging coil 201. The opposing magnetic flux lines result in a levitated force on the superconducting magnet 211, lifting the entire disk 211 above the surface 203. The amount of weight that can be supported on the disk 203 depends on the flux strength created by the charging coil 201. As long as the charging coil 201 is energized and the superconducting magnet remains superconducting, the disk 211 remains levitated above the surface. A lateral stability of the disk may be achieved by making the average winding diameter of the charging coil 201 greater than that of the superconducting magnet 211.

Figure 6:
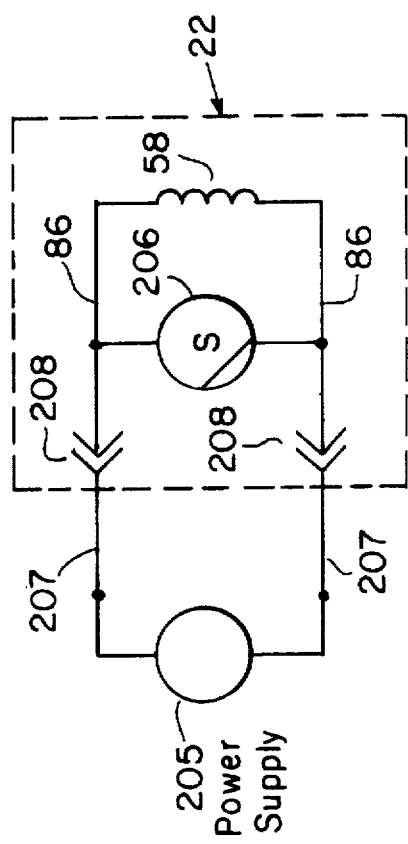
FIG. 6 presents a schematic diagram of a circuit for energizing the superconducting magnet system directly with the use of a power supply.

FIG. 6 presents a schematic electrical diagram for energizing the superconducting magnet system directly with the use of a power supply 205. The dashed lines define the room-temperature shield 22. A superconducting switch 206 shunting the terminals 86 of the magnet system is kept in the normal resistive state (by means of a heater, for example) while the magnet is being energized, forcing most of current from the power supply 205 through the winding 58. In the operating mode, the switch 206 is superconducting and becomes a part of the superconducting circuit to allow a persistent current to flow through the winding 58. The current leads 207 connecting the room temperature end of the circuit to the magnet terminals 86 have "disconnectable" joints 208 so that the leads 207 may be disconnected after the magnet is energized to minimize heat input to the cold body.

The system is preferably equipped with a field sensor and thermocouple temperature sensors. The field sensor is attached to the room temperature region; the thermocouples are attached to the cold body. The wires connecting the thermocouples to the instrumentation are of extremely thin gauge and extremely long length to minimize thermal input due to conduction.

A thermal analysis of a permanent magnet system in accordance with the present invention is now described. A magnet system having a winding geometry with no room temperature bore is used as a basis for the thermal analysis along with the innovative concepts described above.

There are four sources of dissipation in the isolated superconducting magnet system of the present invention: 1) electromagnetic dissipation generated within the magnet winding due to electromagnetic effects; 2) thermal radiation; 3) thermal convection; 4) thermal conduction. In quantifying each of these sources, an ideal spherical winding configuration shall be assumed. Although a real magnet generally requires a central bore for access to a high-field region, the theoretical spherical geometry is amenable to emphasizing important parameters of the system without having the analysis mired by the second-order effects of cylindrical or coiled geometries.

Under the constant-field operating condition assumed for this system, there is no dissipation in the superconducting magnet due to electromagnetic effects, except for those losses generated at conductor-to-conductor splices. For a persistent-mode superconducting magnet in the present system, it is assumed, a priori, that each splice is virtually superconducting and that any dissipation can therefore be neglected.

The theory of radiative heat transfer begins with the Stefan-Boltzmann equation:

$$q_r = e_r \sigma_{SB} T^4 \quad (1)$$

where $q_r$ is the radiative heat flux in Watts per square meter (W/m$^2$) from a surface at temperature T K; $e_r$ is the total emissivity at temperature T; $\sigma_{SB}$ is the Stefan-Boltzmann constant, $5.67 \times 10^{-8}$ W/m$^2$ K$^4$. For a parallel-plate configuration with emissivities of $[e_r]_{cl}$ and $[e_r]_{wm}$, respectively, for a first surface at a cold temperature $T_{cl}$ and a second surface at a warm temperature $T_{wm}$, the effective total emissivity, $[e_r]_{cw}$ is given by:

$$[e_r]_{cw} = \frac{[e_r]_{cl}[e_r]_{wm}}{[e_r]_{cl} + [e_r]_{wm} - [e_r]_{cl}[e_r]_{wm}} \quad (2)$$

The parallel-plate geometric approximation assumes that the two surfaces exchanging heat have similar areas. Although theory distinguishes among parallel-plate, cylindrical, and spherical configurations, in most cryostat applications, the parallel-plate approximation suffices even for non-parallel-plate configurations. This is because in most cryostats, the distance separating the two surfaces is generally much less than a characteristic surface length. Additionally, any error that would invariably be introduced in an estimate of radiative heat input through this geometric approximation is still likely to be considerably less than that introduced by uncertainties associated with emissivities of the surfaces in question. Equation 2 is thus modified to:

$$q_{rd} = [e_r]_{cv} \sigma_{SB}(T_{wm}^4 - T_{cl}^4). \tag{3}$$

For a spherical magnet system of outer radius R, the total radiation heat input to the system, $Q_{rd}$, is given by:

$$Q_{rd} = 4\pi R^2 [e_r]_{cv} \sigma_{SB}(T_{wm}^4 - T_{cl}^4) \tag{4}$$

For a parallel-plate configuration with one plate at a cold temperature $T_{wm}$ and the other at a warm temperature $T_{wm}$, heat flux ($q_g$ W/m²) from the warm plate to the cold plate by convective heat transfer by a "residual" helium gas at pressure $P_g$ Pa, under a vacuum pressure $P_g$ of ~10⁻⁴ torr or less, is given by:

$$q_{cv} = \eta_g P_g (T_{wm} - T_{cl}) \tag{5}$$

$\eta_g$ W/m²·PaK depends not only on $T_{wm}$ and $T_{cl}$ but also on the so-called accommodation coefficient, which for helium varies from 0.3 at room temperature to 1 at 4.2 K. For the temperature range of our interest, $T_{wm}$=300 K and $T_{cl}$~80 K, $q_{cv}$=11 mW/m² at pressure $P_g$=10⁻⁵ torr. Thus, for a spherical system with outer radius R, the total convective heat input to the system, $Q_{cv}$ W, at pressure $P_g$=10⁻⁵ torr, is given by:

$$Q_{cv} = 4\pi(1.1 \times 10^{-2}) R^2 \tag{6}$$

There are two sources of heat input to the system due to thermal conduction. The first is the support structure 24 (see FIG. 1), and the second is pressure relief tube for the solid nitrogen in the event the nitrogen 38 (see FIG. 1).

Total conductive heat input due to the support structure 24, $Q_{sp}$, is given by:

$$Q_{sp} = 2 k_{sp} A_{sp} \frac{(T_{wm} - T_{cl})}{R} \tag{7}$$

where $A_{sp}$ is the total cross section of the support structure connecting between the warm $T_{wm}$ and cold $T_{cl}$ bodies. In Equation 7, the factor of 2 in the right-hand side is to take into account of the extra support structure required to make support direction-independent. The length connecting $T_{wm}$ and $T_{cl}$ is taken to be, at minimum, equal to the radius of the cold body R.

The cross sectional area of the support structure 24 $A_{sp}$ is related to the magnet system's weight, $M_{sy}$. Thus:

$$A_{sp} = \frac{M_{sy} g}{\sigma U_{sp}} \tag{8}$$

where g is the gravitational constant and $\sigma U_{sp}$ is the ultimate strength of the support material. The magnet system weight $M_{sy}$ is given in terms of the system's volume:

$$M_{sy} = \frac{2\pi R^3}{3} (\delta Ag + \delta N_2) \tag{9}$$

In Equation 9, it is assumed that one half of the system's volume is occupied by the winding material typified by silver and the other half by solid nitrogen. Also $\delta Ag$ and $\delta N_2$ are, respectively, densities of silver and solid nitrogen.

Combining Equations 7 through 9, the total conductive heat input due to the support structure is:

$$Q_{sp} = \frac{4\pi g k_{sp}}{3 \sigma U} (\delta Ag + \delta N_2)(T_{wm} - T_{cl}) R^2. \tag{10}$$

Total conductive heat input due to the relief tube, $Q_{rf}$ is given by:

$$Q_{rf} = k_{ss} A_{ss} \frac{(T_{wm} - T_{cl})}{l_{ss}} \tag{11}$$

where $k_{ss}$, $A_{ss}$, $l_{ss}$ are, respectively, the thermal conductivity, cross sectional area, and length of the stainless steel used for the relief tube. By choosing $A_{ss}$ sufficiently small and $l_{ss}$ sufficiently long, for example, by coiling the relief tube 40 about the thermal rod 28 as shown in FIG. 1, then $Q_{rf}$ becomes arbitrarily small in comparison to $Q_{sp}$. It can thus be approximated out of the thermal analysis. Note that even if the solid nitrogen becomes a liquid, and the liquid becomes a gas in the proposed system, these phase changes take place over a long period, and there is thus no need to provide a relief valve with a large opening and thus a large cross-sectional area $A_{ss}$, as is often employed in cryogenic systems containing a low-temperature superconducting magnet.

By combining Equations 4, 6, and 10, a total heat input $Q_{in}$ to the spherical system of outer radius R is given by:

$$Q_{in} = Q_{rd} + Q_{cv} + Q_{sp} = \tag{12}$$
$$\left\{ [e_r]_{cv} \sigma_{SB}(T_{wm}^4 - T_{cl}^4) + 1.1 \times 10^{-2} + \frac{g k_{sp}}{3 \sigma U} (\delta Ag + \delta N_2)(T_{wm} - T_{cl}) \right\} R^2$$

Note that $Q_{in}$ is directly proportional to $R^2$.

Table 1 presents volumetric incremental enthalpies of, silver ($\Delta H_{Ag}$) and solid nitrogen ($\Delta H_{N_2}$) between an initial system temperature of 20 K and temperatures of 40 K, 50 K, and 60 K due to system warming. In converting from specific enthalpy data to volumetric enthalpies, a silver density of 10,500 kg/m³ and solid nitrogen density of 900 kg/m³ were used.

TABLE 1

| Enthalpy Data for Silver and Solid Nitrogen | | |
|---|---|---|
| $T_{op}$[K] | $\Delta h_{Ag}$[MJ/m³] | $\Delta h_{N_2}$[MJ/m³] |
| 20–40 | 9.5 | 22.0 |
| 20–50 | 19.3 | 34.0 |
| 20–60 | 32.0 | 57.0 |

The total enthalpy available for operation, $\Delta H_{sy}$, for a spherical system of outer radius R, with one half of its volume being silver (magnet winding) and the other half being solid nitrogen (extra heat storage), is given by:

$$\Delta H_{sy} = \frac{2\pi}{3} (\Delta h_{Ag} + \Delta h_{N_2}) R^3 \tag{13}$$

By combining Equations. 12 and 13, an expression for the operating duration, $\tau_{op}$ is obtained:

$$Q_{in} \tau_{op} = \Delta H_{sy} \tag{14}$$

Solving for $\tau_{op}$, gives:

$$\tau_{op} = \frac{(\Delta h_{Ag} + \Delta h_{N_2})}{6 \left\{ |e_r|_{cw} \sigma_{SB}(T_{wm}^4 - T_{cl}^4) + 1.1 \times 10^{-2} + \frac{g k_{sp}}{3 \sigma U} (\delta Ag + \delta N_2)(T_{wm} - T_{cl}) \right\}} R \quad (15)$$

Table 2 presents values of $\tau_{op}$, in days (converted from seconds) for the following values of parameters: the temperature of the warm body $T_{wm}=293$ K, or room temperature; the temperature of the cold body $T_{cl}=20$ K (although the temperature of the cold body actually increases from 20 K to a final temperature here it is assumed constant, a conservative assumption); $k_{sp}=0.1$ W/mK (a value close to that for stainless steel, again a conservative assumption); $\sigma U_{sp}=2 \times 10^9$ Pa (a value corresponding to a carbon filament based composite). Values of $[e_r]_{cw}$ and R are variable and indicated in Table 2.

TABLE 2

| $T_{op}$ [K] | R = 0.10 m | R = 0.25 m | R = 0.50 m |
|---|---|---|---|
| Operating duration $\tau_{op}$ in days for Selected Values of $T_{op}$, R, and $[e_r]_{cw}$: | | | |
| $[e_r]_{cw} = 5 \times 10^{-4}$ | | | |
| 20–40 | 39 | 98 | 196 |
| 20–50 | 66 | 165 | 331 |
| 20–60 | 110 | 276 | 552 |
| $[e_r]_{cw} = 1 \times 10^{-4}$ | | | |
| 20–40 | 59 | 147 | 293 |
| 20–50 | 99 | 248 | 496 |
| 20–60 | 166 | 414 | 829 |

The values of $\tau_{op}$ given in Table 2 are for a magnet system modeled as a sphere, which has the lowest surface area to volume ratio of any geometric structure. Real magnets' ratios are greater than spheres and hence $\tau_{op}$ would be of shorter duration than those given in Table 2, by perhaps as much as a factor of 2.

For a given system, $\tau_{op}$ depends critically on a good vacuum. It is therefore recommended that while the system is not in transit, it should be connected to a pumping station.

The specific parameters and designs used for the system components in the present discussion are chiefly for illustrative purposes to indicate principal functions of each component. For example, it should be noted that the volumetric fraction of solid nitrogen need not be ~50% as used in the quantitative analysis. It could be greater than or less than 50%, depending on the requirements of a particular system. The same is true for the specific component designs depicted schematically in the various figures. In an actual system, the threaded joint for thermally coupling the thermal rod and the extension rod may be replaced with another mechanism.

The present invention has applications in the fields of MRI, NMR, and magnetic levitation for trains. In each of these applications, system portability due to the absence of a permanent cryocooler would present a significant advantage. For example, in the application of magnetic levitation for trains, the train may be charged in the morning by a cryocooler located at the terminal. After operating all day without the cryocooler, the train may be returned to the terminal at night to have the magnets recooled at cryocooler stations. In this manner, the train operates separate from the cryocooler.

While this invention has been particularly shown and described with references to preferred embodiments thereof, it will be understood by those skilled in the art that various changes in form and detail may be made therein without departing from the spirit and scope of the invention as defined by the appended claims.

We claim:

1. An apparatus for generating a magnetic field comprising:
   a superconducting magnet in thermal contact with a cold body, the magnet operating in a persistent state at a temperature below its critical temperature $T_c$, for generating a magnetic field;
   insulation surrounding the cold body for minimizing heat input to the magnet; and
   a cooling device adapted to be placed in thermal contact with the cold body for cooling the magnet upon the magnet temperature rising to a first temperature $T_1$, $T_1$ being less than $T_c$, the cooling device thereby cooling the magnet until the magnet temperature lowers to a second temperature $T_2$, such that the superconducting magnet continues to generate a magnetic field over an extended period of time and over a range of temperatures between $T_2$ and $T_1$ before recooling is required.

2. The apparatus of claim 1 wherein the length of the extended period of time is determined by the duration of time needed for the temperature of the magnet to rise from $T_2$ to $T_1$.

3. The apparatus of claim 1 wherein the cooling device is adapted for coupling to the cold body during cooling and for decoupling from the cold body upon the cold body cooling to the second temperature $T_2$ without interrupting generation of the magnetic field.

4. The apparatus of claim 1 wherein the cold body is a volume of solid nitrogen.

5. The apparatus of claim 4 wherein the volume of solid nitrogen is approximately the same size as the magnet.

6. The apparatus of claim 1 wherein $T_1$ is approximately 63 K and wherein $T_2$ is approximately 20 K.

7. The apparatus of claim 1 wherein the superconducting magnet is selected from the group comprising solenoidal, dipole, quadruple, and saddle.

8. The apparatus of claim 1, wherein the superconducting magnet has a bore at room temperature.

9. The apparatus of claim 1 wherein the superconductor is a high-temperature superconductor.

10. A method for generating a magnetic field comprising the steps of:
    operating a superconducting magnet in a persistent state at a temperature below its critical temperature $T_c$ by thermally coupling the magnet to a cold body, the magnet generating a magnetic field;
    insulating the cold body to minimize heat input to the magnet; and
    cooling the magnet to a second temperature $T_2$ when the magnet temperature rises to a first temperature $T_1$ by thermally coupling a cooling device to the cold body, wherein $T_1$ is less than $T_c$; such that the magnet generates a magnetic field over an extended period of time and over a range of temperatures between $T_2$ and $T_1$ before requiring recooling.

11. The method of claim 10 wherein the period of time is determined by the duration of time for the magnet temperature to rise from $T_2$ to $T_1$.

12. The method of claim 10 wherein the cooling device is decoupled from the cold body upon the magnet cooling to the second temperature $T_2$ without interrupting generation of the magnetic field.

13. The method of claim 10 wherein the cold body comprises a volume of solid nitrogen.

14. The method of claim 13 further comprising the step of forming the volume of solid nitrogen to be a size approximately the same as the magnet size.

15. The method of claim 10 wherein $T_1$ is approximately 63 K and wherein $T_2$ is approximately 20 K.

16. The method of claim 10 further comprising the step of selecting the superconducting magnet from the group comprising solenoidal, dipole, quadruple, and saddle.

17. The method of claim 10 further comprising the step of forming the superconducting magnet to have a bore at room temperature.

18. The method of claim 10 further comprising the step of forming the superconducting magnet with a high-temperature superconductor.

19. An apparatus for generating a magnetic field comprising:

a superconducting magnet in thermal contact with a cold body, the magnet operating in a persistent state at a temperature below its critical temperature $T_c$, for generating a magnetic field;

insulation surrounding the magnet for minimizing heat input to the magnet; and a cooling device for thermally contacting the cold body for cooling the magnet upon the magnet temperature rising to a first temperature $T_1$, $T_1$ being less than $T_c$, the cooling device being decoupled from the cold body upon the magnet temperature lowering to a second temperature $T_2$, such that the superconducting magnet continues to generate a magnetic field over an extended period of time and over a range of temperatures between $T_2$ and $T_1$ before recooling is required.

20. A method for generating a magnetic field comprising the steps of:

operating a superconducting magnet in a persistent state at a temperature below its critical temperature $T_c$ by coupling the magnet to a cold body, the magnet generating a magnetic field;

insulating the cold body to minimize heat input to the magnet;

coupling a cooling device to the cold body for cooling the magnet when the magnet temperature rises to a first temperature $T_1$, $T_1$ being less than $T_c$; and decoupling the cooling device from the cold body when the magnet temperature lowers to a second temperature $T_2$, such that the magnet generates a magnetic field over an extended period of time and over a range of temperatures between $T_2$ and $T_1$ before requiring recooling.

* * * * *